(12) United States Patent  
Dechene et al.

(10) Patent No.: US 8,656,322 B1  
(45) Date of Patent: Feb. 18, 2014

(54) FIN DESIGN LEVEL MASK DECOMPOSITION FOR DIRECTED SELF ASSEMBLY

(71) Applicant: International Business Machines Corporation, Armonk, NY (US)

(72) Inventors: Daniel J. Dechene, Wappingers Falls, NY (US); Michael A. Guillorn, Yorktown Heights, NY (US); Kafai Lai, Poughkeepsie, NY (US); Jed W. Pitera, Portola Valley, CA (US); HsinYu Tsai, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/744,606

(22) Filed: Jan. 18, 2013

(51) Int. Cl.  
*G06F 17/50* (2006.01)

(52) U.S. Cl.  
USPC .......................................................... 716/55

(58) Field of Classification Search  
USPC .......................................................... 716/55  
See application file for complete search history.

(56) References Cited

U.S. PATENT DOCUMENTS

| 8,114,306 | B2 | 2/2012 | Cheng et al. | |
|---|---|---|---|---|
| 2005/0126464 | A1 * | 6/2005 | Lang et al. | 114/67 A |
| 2010/0294740 | A1 | 11/2010 | Cheng et al. | |
| 2010/0297847 | A1 | 11/2010 | Cheng et al. | |
| 2011/0209106 | A1 | 8/2011 | Cheng et al. | |

FOREIGN PATENT DOCUMENTS

| WO | 2006112887 A2 | 10/2006 |
|---|---|---|
| WO | 2010133422 A2 | 11/2010 |
| WO | 2010133422 A3 | 11/2010 |
| WO | 2012026973 A2 | 3/2012 |

* cited by examiner

*Primary Examiner* — Suresh Memula  
(74) *Attorney, Agent, or Firm* — Scully, Scott, Murphy & Presser, P.C.; Parashos Kalaitzis, Esq.

(57) ABSTRACT

A design layout including shapes of target areas for forming semiconductor fins employing directed self-assembly can be decomposed into guiding patterns and cut patterns. The lengthwise edges of the shapes of target areas are adjusted. Widthwise edges of the adjusted shapes are extended outward to generate diffusion shapes. Guiding pattern shapes are then generated employing the diffusion shapes. Taper edges are adjusted based on process bias of a photoresist material to be subsequently employed. Optionally, a portion of a guiding pattern shape between diffusion shapes may be removed as a connection shape. The guiding pattern shapes can define at least one guiding pattern mask for lithographic pattern of guiding pattern shapes, and cut shapes can be derived from the diffusion shapes and the guiding pattern shapes. The guiding pattern shapes and the cut shapes may be adjusted to accommodate effects at device cell edges and at device macro edges.

20 Claims, 16 Drawing Sheets

FIN DESIGN LEVEL MASK DECOMPOSITION FOR DIRECTED SELF ASSEMBLY

BACKGROUND

The present disclosure relates generally to a method of designing a set of masks for a lithographic design level, and more particularly to a method of generating shapes for multiple sets of multiple lithographic masks for patterning semiconductor fins through use of a directed self-assembly material, and an apparatus for implementing the same.

Optical lithography has inherent limitations for minimum dimensions due to finite resolution of optical radiation. Directed self-assembly (DSA) offers an alternative method for forming periodic structures such as a one dimensional array of semiconductor line structures. In order to convert the array of semiconductor line structures into semiconductor fins, it is necessary to etch away portions of the semiconductor line structures employing lithographic masks. However, corner rounding, overlay variations, and other lithographic limitations apply when the semiconductor line structures are lithographically patterned, thereby compromising the reproducibility and reliability of semiconductor fins thus obtained.

SUMMARY

A design layout including shapes of target areas for forming semiconductor fins employing directed self-assembly can be decomposed into a set of guiding patterns and a set of cut patterns. The lengthwise edges of the shapes of target areas are adjusted so that the widths of directed self-assembly channel regions conform to predefined target values compatible with the characteristic dimensions of directed self-assembly material to be employed. The complement of the adjusted shapes constitutes guiding pattern raw patch shapes. Widthwise edges of the adjusted shapes are extended outward to generate diffusion shapes. Guiding pattern shapes are generated by subtracting the diffusion shapes from the guiding pattern raw patch shapes. Taper edges are adjusted based on process bias of a photoresist material to be subsequently employed. Optionally, a portion of a guiding pattern shape may be removed if the portion can connect at least two diffusion shapes along the widthwise direction with a width that can facilitate formation of a self-aligned line pattern along the widthwise direction. The guiding pattern shapes can define at least one guiding pattern mask for lithographic pattern of guiding pattern shapes, and cut shapes can be derived from the diffusion shapes and the guiding pattern shapes. The guiding pattern shapes and the cut shapes may be adjusted to accommodate effects at device cell edges and at device macro edges.

The combination of the guiding pattern shapes and the cut shapes can be employed to generate a set of at least one guiding pattern mask and at least one cut mask. In one embodiment, the guiding pattern shapes can be incorporated into a single guiding pattern mask or a plurality of guiding pattern masks for reproducing the guiding pattern shapes in a guiding pattern design level for a material layer. In another embodiment, the cut shapes can be incorporated into a single cut mask or a plurality of cut masks for reproducing the cut shapes in a cut shape design level in another material layer. In yet another embodiment, at least one blocking shapes can be generated from the combination of the guiding pattern shapes and the cut shapes in a manner that encompasses regions in which semiconductor fin structures are to be formed, and at least one blocking mask can be designed. Use of the at least one blocking mask can provide a greater overlay tolerance to the shapes in a cut design level mask.

According to an aspect of the present disclosure, a method for generating shapes for mask design levels for patterning fin structures is provided. The method includes a first step of providing an initial design layout including fin template shapes and fin region shapes. Intersections of the fin template shapes and the fin region shapes correspond to target areas for fin structures. The method further includes a second step of quantizing and centering channel regions between lengthwise edges neighboring pairs of the fin region shapes by moving the lengthwise edges along a widthwise direction; a third step of generating at least one guiding pattern raw patch shape as at least one shape that correspond to complementary areas of the fin region shapes; a fourth step of generating diffusion shapes by extending lengthwise edges of the fin region shapes along a lengthwise direction; and a fifth step of generating at least one guiding pattern shape by subtracting areas of the diffusion shapes from the at least one guiding pattern raw patch shape; a sixth step of generating at least one guiding pattern shape set. Each of the at least one guiding pattern shape set includes shapes that define a pattern in one of at least one guiding pattern mask. In addition, the method includes a seventh step of generating at least one cut shape set. Each of the at least one cut shape set includes shapes that define a pattern in one of at least one cut mask. At least one step among the second, third, fourth, fifth, sixth, and seventh steps is performed employing an apparatus including one or more processors in communication with a memory and configured to perform the at least one step.

According to another aspect of the present disclosure, an apparatus for generating shapes for mask design levels for patterning fin structures is provided. The apparatus includes one or more processors in communication with a memory and configured to run an automated program. The automated program includes a first step of receiving an initial design layout including fin template shapes and fin region shapes. Intersections of the fin template shapes and the fin region shapes correspond to target areas for fin structures. The automated program further includes a second step of quantizing and centering channel regions between lengthwise edges neighboring pairs of the fin region shapes by moving the lengthwise edges along a widthwise direction; a third step of generating at least one guiding pattern raw patch shape as at least one shape that correspond to complementary areas of the fin region shapes; a fourth step of generating diffusion shapes by extending lengthwise edges of the fin region shapes along a lengthwise direction; a fifth step of generating at least one guiding pattern shape by subtracting areas of the diffusion shapes from the at least one guiding pattern raw patch shape; and a sixth step of generating at least one guiding pattern shape set. Each of the at least one guiding pattern shape set includes shapes that define a pattern in one of at least one guiding pattern mask. The automated program further includes a seventh step of generating at least one cut shape set. Each of the at least one cut shape set includes shapes that define a pattern in one of at least one cut mask.

DETAILED DESCRIPTION

Figure 1:
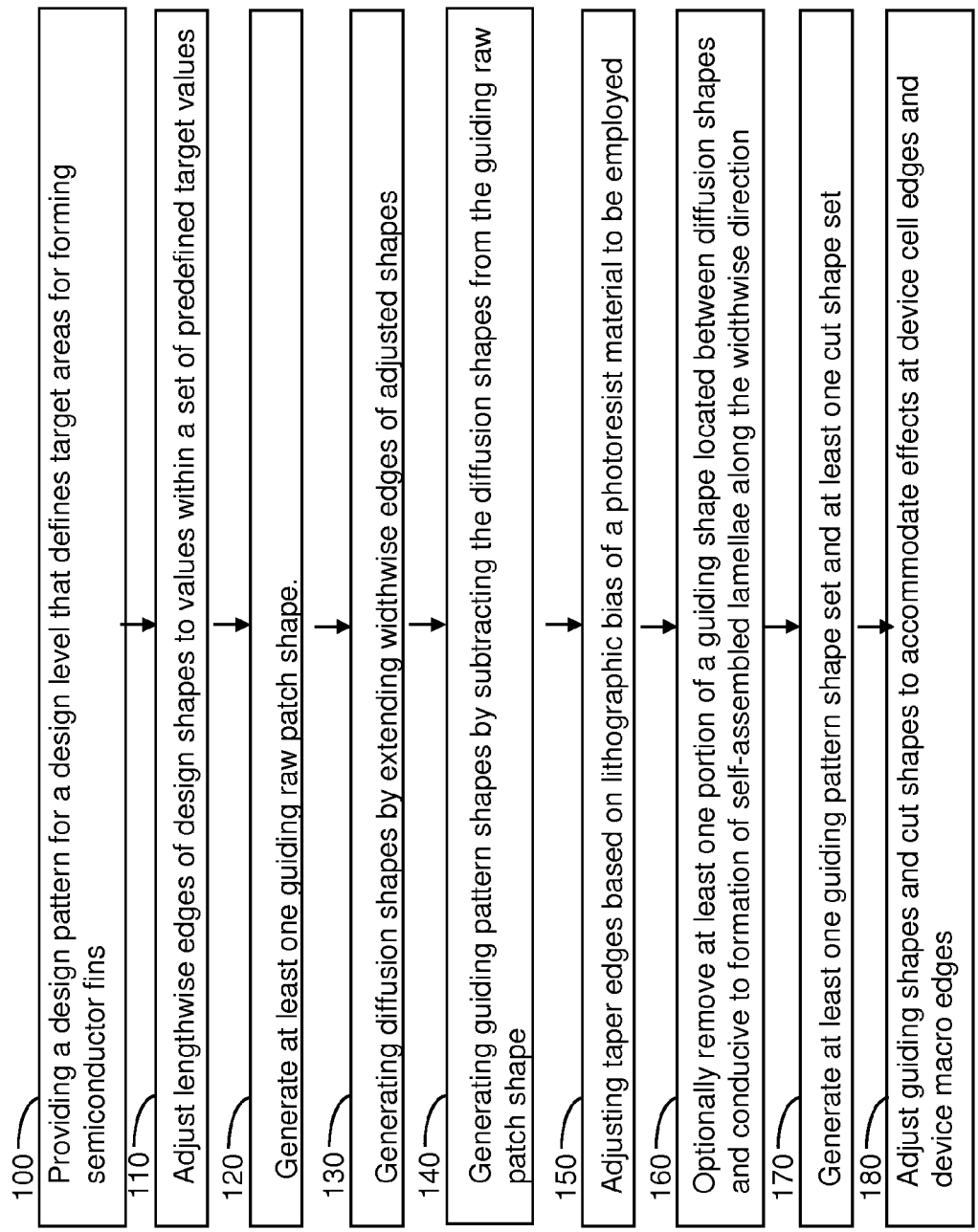
FIG. 1 is a flow chart illustrating the steps of an embodiment of the present disclosure.

As stated above, the present disclosure relates to a method of generating shapes for multiple sets of multiple lithographic masks for patterning semiconductor fins through use of a directed self-assembly material, and an apparatus for implementing the same. Aspects of the present disclosure are now described in detail with accompanying figures. It is noted that like and corresponding elements are referred to by like reference numerals. The drawings are not drawn to scale.

Referring to FIG. 1, a flow chart illustrates steps for generating shapes for mask design levels for patterning fin structures according to an embodiment of the present disclosure. A design layout is provided, which includes shapes of target areas for forming semiconductor fins. As used herein, a "design layout" refers to a collection of data that represents a geometrical relationship between various structural elements of a set of semiconductor devices that can be manufactured on a semiconductor substrate. As used herein, a "design level" is a level within a design layout that includes geometrical shapes that are related, directly or indirectly, to a same set of processing steps for forming physical objects on a semiconductor substrate. The geometrical shapes may be represented in a graphics format or in a non-graphics format. As used herein, a mask design level is a design level including geometrical shapes that can be employed to form a physical lithographic mask without further modification of the geometrical shapes other than optical proximity correction or line edge biasing. As used herein, a non-mask design level is a design level that is not employed to manufacture a physical lithographic mask, but is employed to facilitate generation of at least one mask design level.

The various steps of the flow chart can be implemented by an apparatus including one or more processors in communication with a memory, i.e., a memory device. The one or more processors can be configured to run an automated program that includes instructions for implementing one, a plurality, or all of the steps of the flow chart.

Referring to step 100, the automated program can be configured to receive a design layout for a design level that defines target areas for forming semiconductor fins. The automated program can perform various steps for generating shapes for mask design levels for patterning physical fin structures on a semiconductor substrate. The design layout is modified and subsequently decomposed into a set of guiding patterns and a set of cut patterns in subsequent processing steps. Step 100 represents the step in which the initial design layout is provided.

Figure 2:
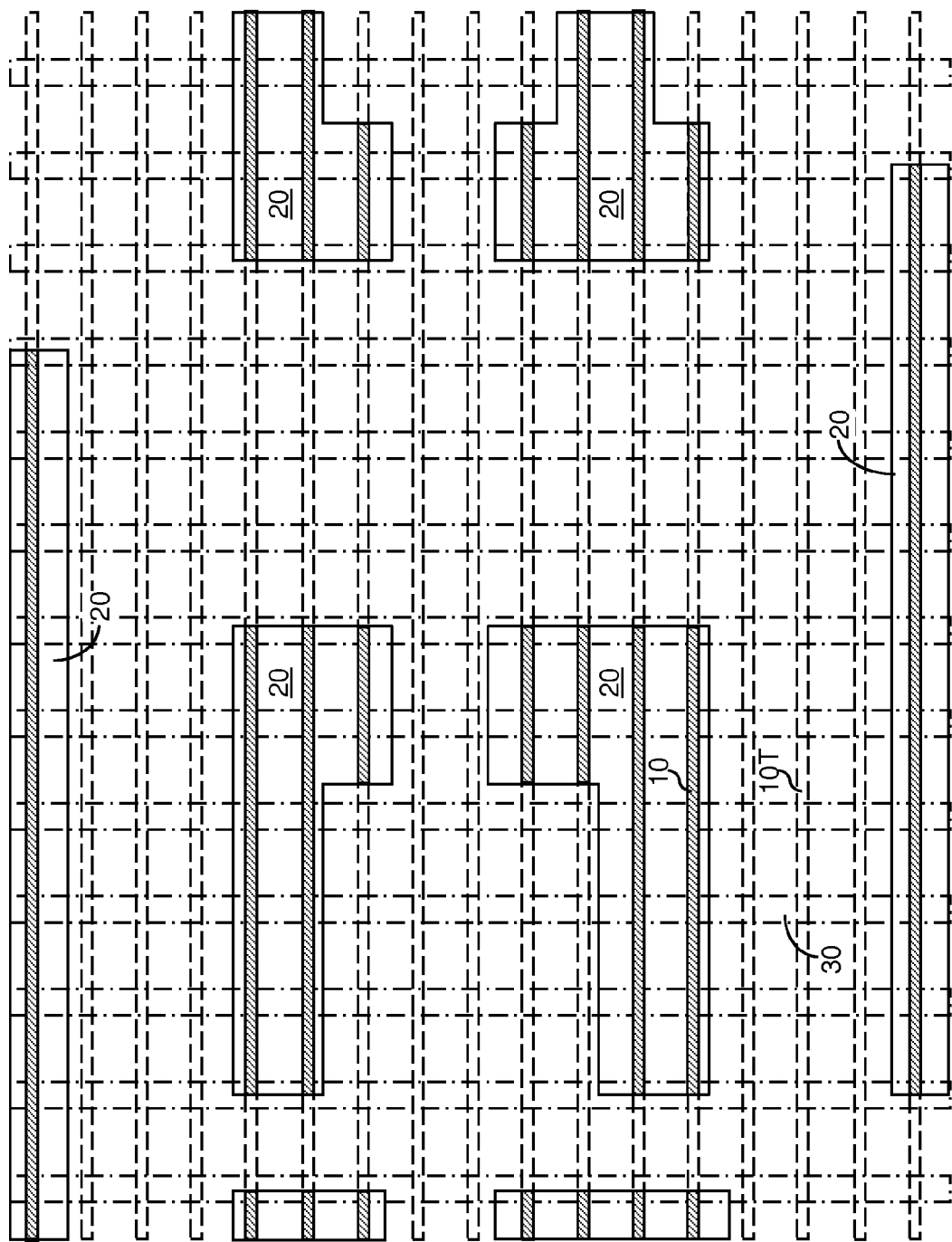
FIG. 2 is a plan view of a first exemplary design layout including fin template shapes 10T, fin region shapes 20, fin shapes 10 defined by intersections of the fin template shapes and fin region shapes, and gate shapes 30 according to an embodiment of the present disclosure.

Referring to FIG. 2, a plan view of a first exemplary design layout that can be provided at step 100 is shown, which is an initial design layout to be processed according to methods of the present disclosure. The first exemplary design layout can be a subset of a larger design layout. The first exemplary design layout includes a plurality of design levels. The plurality of design levels can include a fin template design level that includes fin template shapes 10T, a fin region design level or an "RX" design level that includes fin region shapes 20, and a gate design level that includes gate shapes 30. The plurality of design levels can also include a fin shape design level (or a "fin shape design level") including fin shapes 10 that are defined by intersections of the fin template shapes 10T and fin region shapes 20. Alternately, the a fin shape design level may not be explicitly provided in the initial design layout, and may be optionally generated in a subsequent processing step as needed, e.g., at a processing step at which the fin shapes 10 become different from the intersections of the fin template shapes 10T and the fin regions shapes 20, for example, by biasing of taper edges.

The area of the fin shapes 10 in the design layout corresponds to the physical area on a semiconductor substrate in which patterned semiconductor fins are to be formed as clusters of objects having three-dimensional shapes substantially the same as rectangular parallelepipeds after formation of prototype semiconductor fins by directed self-assembly and subsequent removal of peripheral portions of the prototype semiconductor fins by a combination of lithographic methods and etching. The intersections of the fin template shapes 10T and the fin region shapes 20 are shapes of target areas for fin structures, i.e., correspond to target areas for physical fin structures on a semiconductor substrate.

Optionally, the initial design layout may, or may not, be provided with the fin template shapes 10T. If the fin template shapes 10T are not provided, the fin template shapes 10T may be generated by extending the fin shapes in a lengthwise direction, which is a direction that is parallel to two longer parallel pairs of edges of each fin shape 10, which has a rectangular shape. The fin template shapes 10T are formed as a one-dimensional periodic array extending across each device cell region and across each device macro region. As used herein, a "device cell" refers to a unit semiconductor device such as an inverter, a NOR gate, a NAND gate, a buffer, etc. As used herein, a "device macro" refers to a semiconductor circuit that includes a plurality of device cells. Vacant regions between clusters of fin template shapes 10T may be filled with additional fin template shapes 10T within each device macro region so that each device region is filled with a one-dimensional array of fin template shapes 10T.

Gate shapes 30 represent include regions in which gate electrodes can be subsequently formed. The physical structures for gate electrodes are formed within regions corresponding to the areas of the gate shapes 30 within the initial design layout. In one embodiment, the gate shapes 30 can be provided as line shapes that extend along a direction that is perpendicular to the fin template shapes 10T. In one embodiment, the gate shapes 30 can be provided as a one-dimensional array of line shapes having a periodic spacing thereamongst. In one embodiment, the gate shapes 30 may be provided in the initial design layout as rectangular shapes that correspond to areas of physical gate structures to be formed on a semiconductor substrate. In this case, each gate shape 30 in FIG. 2 may be replaced with a plurality of gate shapes within the areas of the illustrated gate shape 30, and some of the gate shapes 30 may be absent. In other words, the gate shapes 30 may be provided as a plurality of line shapes 30 such that each line shape 30 extends across a device macro region, or may be provided as patterned shapes that reflect the actual shape of gate lines to be formed.

Figure 3:
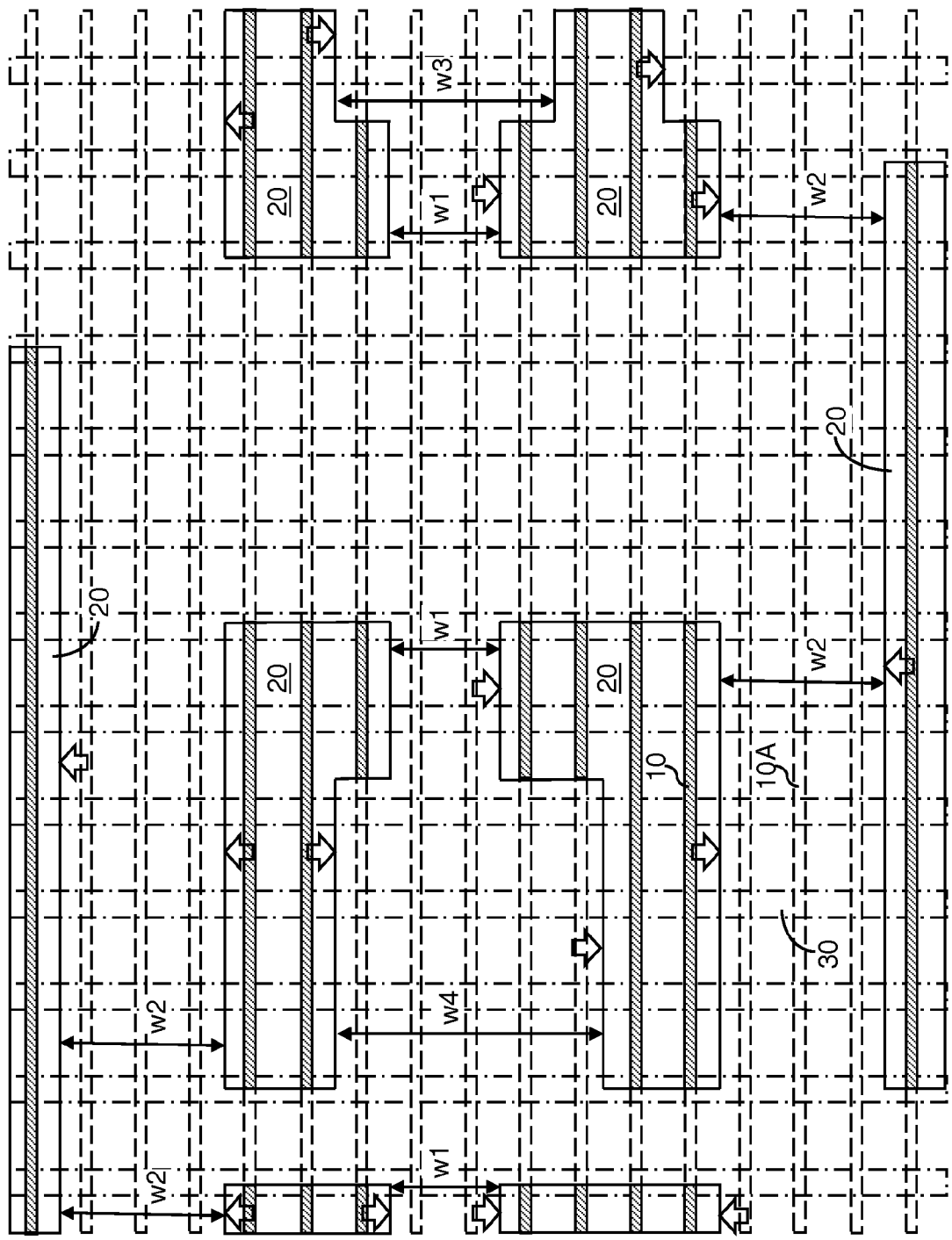
FIG. 3 is a plan view of the first exemplary design layout after quantization and centering of the widths of channel regions according to an embodiment of the present disclosure.

Referring to FIG. 3 and step 110 of FIG. 1, the lengthwise edges of the fin region shapes 20 are adjusted so that the widths of directed self-assembly channel regions conform to predefined target values compatible with the characteristic dimensions of directed self-assembly material to be employed.

As used herein, "lengthwise edges" refer to edges that extend along the lengthwise direction of the fin template shapes 10T and/or the lengthwise direction of the fin shapes 10T. As used herein, "widthwise edges" refer to edges that extend along the direction that is perpendicular to the lengthwise direction of the fin template shapes 10T and/or the lengthwise direction of the fin shapes 10.

As used herein, "directed self-assembly" refers to a method of aligning at least two materials in a directed self-assembly material using at least one guiding pattern structure such that the at least two materials are self-aligned to the geometrical features of the at least one guiding pattern. The at least two materials can be, for example, block polymer components in a block copolymer material.

The directed self-assembly material can be applied, for example, by spin coating. The directed self-assembly material includes but is not limited to block copolymers, block terpolymers, homopolymers, and blends of these polymers, and is capable of self-organizing into nanometer-scale patterns. The directed self-assembly material comprises at least a first polymeric block component and a second polymeric block component that are immiscible with each other. The directed self-assembly material may be self-planarizing. The directed self-assembly material can be diblock copolymers, triblock copolymers or terpolymers, or multiblock copolymers or terpolymers. The block components themselves can be homopolymers or copolymers. Different kinds of block copolymers can be used in the self-aligned assembly, including an amphiphilic organic block copolymer, amphiphilic inorganic block copolymer, organic diblock copolymer, organic multi-block copolymer, inorganic-containing diblock copolymer, inorganic-containing multi-block copolymer, linear block copolymer, star block copolymer, dendritic block copolymer, hyperbranched block copolymer, graft block copolymer, or a combination comprising at least one of the foregoing block copolymers. In an embodiment, the directed self-assembly material is a diblock copolymer.

As used herein, a directed self-assembly channel region, or a "channel region" refers to a region between two lengthwise edges of a neighboring pair of fin region shapes 30 that are spaced along the widthwise direction of the fin template shapes 10T, i.e., the direction that is perpendicular to the lengthwise direction of the fin template shapes 10T. A "width" of a directed self-assembly channel region refers to the dimension along the widthwise direction of the fin template shapes 10T between the two lengthwise edges of a neighboring pair of fin region shapes 30.

The width of each channel region is quantized. As used herein, to "quantize" or "quantization" refers to the act of limiting allowable values for a parameter to a discrete set of allowed values provided by a predetermined process. Specifically, the allowable values for the width of each channel region is selected from a discrete set of allowed values that is determined by the pitch of the fin template shapes 10T and the chemical properties of a directed self-assembly material to be employed. Thus, the quantizing of the widths of the channel regions is performed such that each channel regions has a width selected from a set of quantized dimensions. The quantized widths are based on a characteristic dimension of a self-assembly material to be employed in a manufacturing process for replicating the fin shapes 10.

In one embodiment, the set of quantized dimensions can be selected such that a width of each portion of a neighboring fin region shape 20 is substantially the same as the total length of an alternating series of N domains of a first block polymer unit alternating with (N+1) domains of a second block polymer unit in a directed self-assembly material, in which N is a positive integer, i.e., an integer selected from 2, 3, 4, 5, etc. N corresponds to the number of the fin template shapes 10T within the corresponding portion of the fin region shape 20. During the self-assembly of the directed self-assembly material, N domains including first block polymer units are formed in physical areas corresponding to the areas of the fin shapes 10 in the design layout, and (N+1) domains including second block polymer units are formed in physical areas corresponding to the areas outside of the fin shapes 10 and inside of the corresponding fin region shape 20 in the design layout.

In one embodiment, the set of quantized dimension can be a set of dimensions given by $ja-b$, in which $a$ is the characteristic dimension of the self-assembly material, and is equal to a sum of a length of a first block polymer unit in a directed self-assembly material and a length of a second block polymer unit in the directed self-assembly material, and $b$ is the length that is less than the sum, and $j$ is a positive integer, i.e., an integer selected from 1, 2, 3, 4, etc. The dimension $a$ is selected to match the pitch of the fin template shapes 10T in the design layout, and the dimension $b$ is determined by chemical properties of the first and second block polymer units. This process is referred to as "quantization" of the widths of the channel regions.

In addition, the channel regions are centered relative to the set of fin shapes 10 within the channel region. For example, if the width of a channel region is ja−b as discussed above, the distance along the widthwise direction between an edge of a channel region and center line through a most proximal fin shape 10 along the lengthwise direction can be (a−b)/2.

Thus, all lengthwise edges of the fin shapes 10 are compared with a target position that conforms to the constraint for quantization. Each lengthwise edge of a channel region is a lengthwise edge of a corresponding fin shape 10. Each target position for a lengthwise edge of a channel region is located between the same pair of neighboring template fin shapes 10T as the original edge of the channel region as provided in the initial design layout. This process is referred to as "centering" of the channel regions.

The quantization and centering of the channel regions are performed by adjusting the lengthwise edges of the directed self-assembly channel regions, i.e., by moving the lengthwise edges along the widthwise direction, so that the widths of the channel regions conform to predefined target values compatible with the characteristic dimensions of directed self-assembly material to be employed, and the channels are centered with respect to the set of N fin shapes 10 within the channel region. The integer N can vary from channel region to channel region.

Directions of movement of the lengthwise edges of the fin shapes 30 (which are lengthwise edges of the channel regions) are illustrated by arrows in FIG. 3. The quantized widths of the channel regions form discrete values, which can be, for example, a first width w1, a second width w2, a third width w3, a fourth width w4. In a non-limiting illustrative example, the first width w1 can be 2a−b, the second width can be 3a−b, the third width can be 4a−b, and the fourth width can be 5a−b. FIG. 3 is a plan view of the first exemplary design layout after quantization and centering of the widths of channel regions according to an embodiment of the present disclosure.

Figure 4:
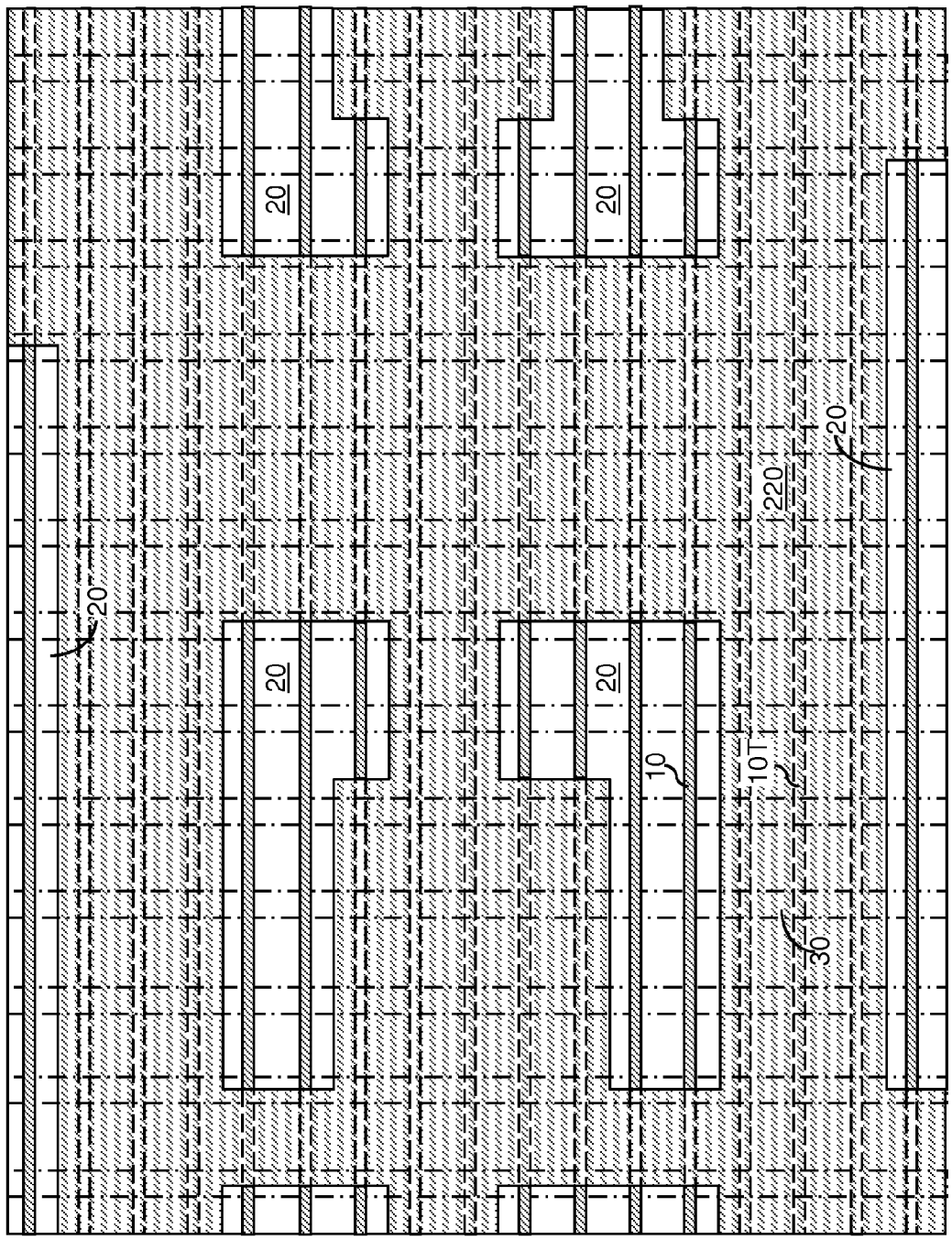
FIG. 4 is a plan view of the first exemplary design layout after guiding pattern raw patch shapes according to an embodiment of the present disclosure.

Referring to FIG. 4 and step 120 of FIG. 1, at least one guiding pattern raw patch shape 220 is generated. The at least one guiding pattern raw patch shape 220 is the collection of the complement of the fin shape regions 20 as modified at step 110 across all device regions. In other words, for each device region that includes any device cell or any device macro, a complement of the fin shape regions 20 therein is generated. The complements of the fin shape regions 20 are then collected across the device cells and the device macros to generate the at least one guiding pattern raw patch shape 220. If all device cells and all device macros are adjoined to one another, the at least one guiding pattern raw patch shape 220 can be a single guiding pattern raw patch shape 220. Alternately, the at least one guiding pattern raw patch shape 220 can be a plurality of guiding pattern raw patch shapes 220. The at least one guiding pattern raw patch shape 220 includes at least one shape that correspond to complementary areas of the fin region shapes 220, as adjusted at step 110.

Figure 5:
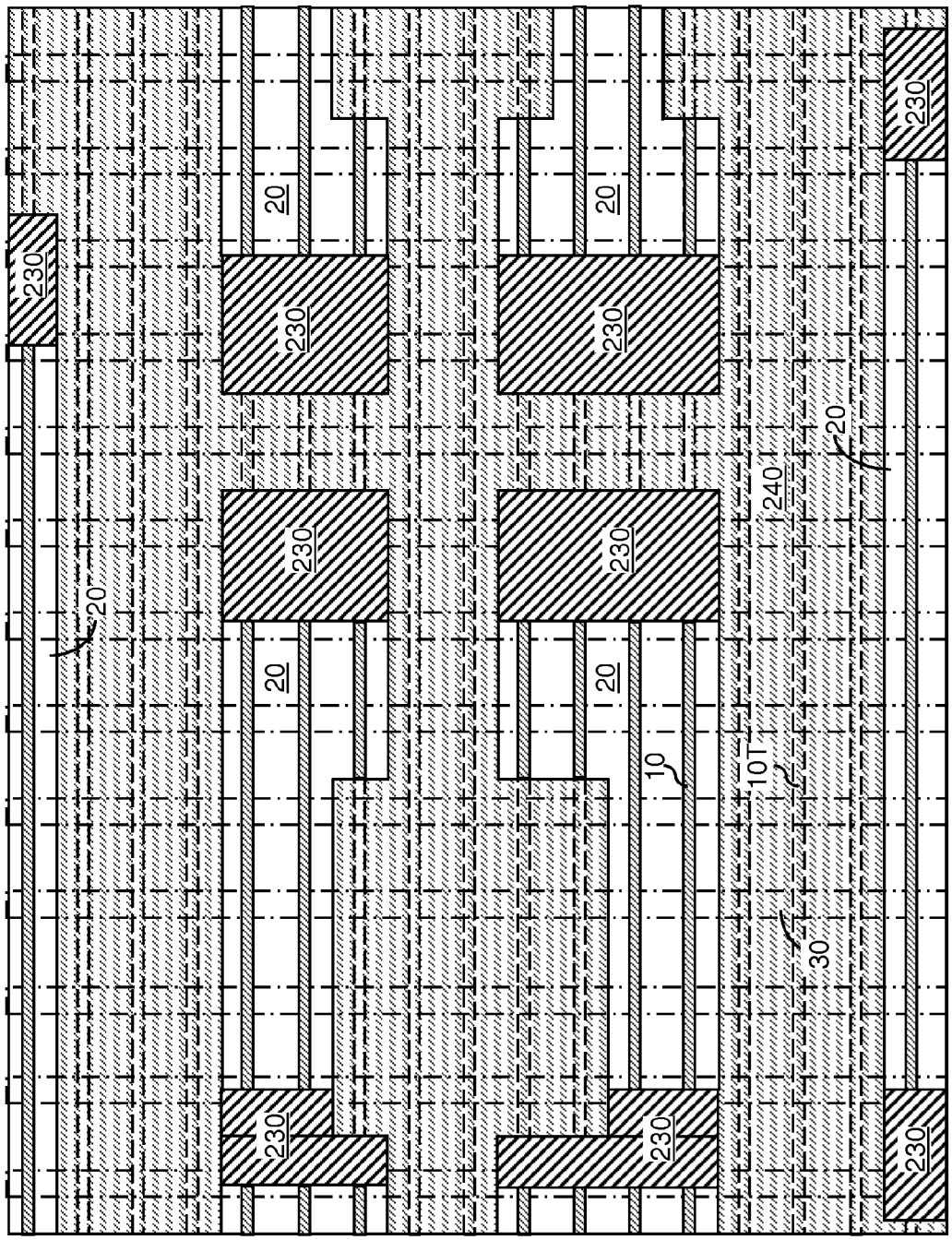
FIG. 5 is a plan view of the first exemplary design layout after generation of diffusion shapes by extending widthwise edges of fin region shapes according to an embodiment of the present disclosure.

Referring to FIG. 5 and step 130 of FIG. 1, diffusion shapes 230 are generated by extending widthwise edges of fin region shapes 20. As used herein, to "extend" or "extension" of an edge refers to generation of a duplicate of the edge and moving the edge in a direction perpendicular to the direction of the edge. Specifically, a duplicate of a non-taper widthwise edge is generated for each non-taper widthwise edge, and is laterally shifted along the lengthwise direction outward, i.e., away, from the corresponding fin region shape 20.

As used herein, a "non-taper widthwise edge" refers to a widthwise edge of a shape that defines a most distal end of the shape along a lengthwise direction. Thus, a shape extends only toward one lengthwise direction from any non-taper widthwise edge, and does not extend toward both lengthwise directions from a non-taper widthwise edge. As used herein, a "taper widthwise edge" or a "taper edge" refers to a widthwise edge from which a shape extend toward both lengthwise directions. Thus, a lengthwise edge adjoining a taper widthwise edge extends along one lengthwise direction, and another lengthwise edge adjoining the taper widthwise edge extends along the opposite lengthwise direction.

Each area between a laterally shifted duplicate of the non-taper widthwise edge and the corresponding original position of the non-taper widthwise edge is a diffusion shape. Only non-taper widthwise edges of fin regions shapes 20 are extended along the lengthwise direction of the template fin shapes 10T.

In one embodiment, the extension of the fin region shapes 20 can be performed incrementally. The increment can be a predefined quantity. In one embodiment, the increment can be the same as the minimum grid dimension for the design layout. As used herein, a "grid dimension" refers to the minimum distance between points within a design layout. In another embodiment, the embodiment can be multiples of the minimum grid dimension. In yet another embodiment, the increment can be selected such that each shifted duplicate edge is placed at a midpoint between a neighboring pair of gate shapes 30, or in the middle of a gate shape. The set of widthwise lines extending along the widthwise direction and passing through a geometrical center of a gate shape 30 or a midpoint between a neighboring pair of gate shapes 30 is herein referred to as node lines. In one embodiment, the extension distance, i.e., the distance by which a duplicate of an edge is shifted, can be greater than a minimum dimension, which can be, for example, one half of the minimum width for shapes that can be formed in a cut mask or one half of a minimum spacing between adjacent regions of fin shapes allowed in design rules.

The incremental extension of the non-taper widthwise edges can terminate when a displaced duplicate of a non-taper widthwise edge meets another displaced duplicate of a non-taper widthwise edge, or when the extension distance reaches a predefined maximum limit. For example, the predefined maximum limit can be set such that each diffusion shape 230 includes not more than T node lines, in which T is a positive integer. In one embodiment, T can be selected from 2, 3, 4, 5, 6, 7, and 8.

Referring to step 140 of FIG. 1, once the diffusion shapes 230 are removed from the at least one guiding pattern raw patch shape 220, the remaining portions of the at least one guiding pattern raw patch shape 220 constitutes guiding pattern shapes 240. Thus, the guiding pattern shapes 240 are generated by subtracting the diffusion shapes 230 from the guiding pattern raw patch shapes 220 as generated at step 120.

Figure 6:
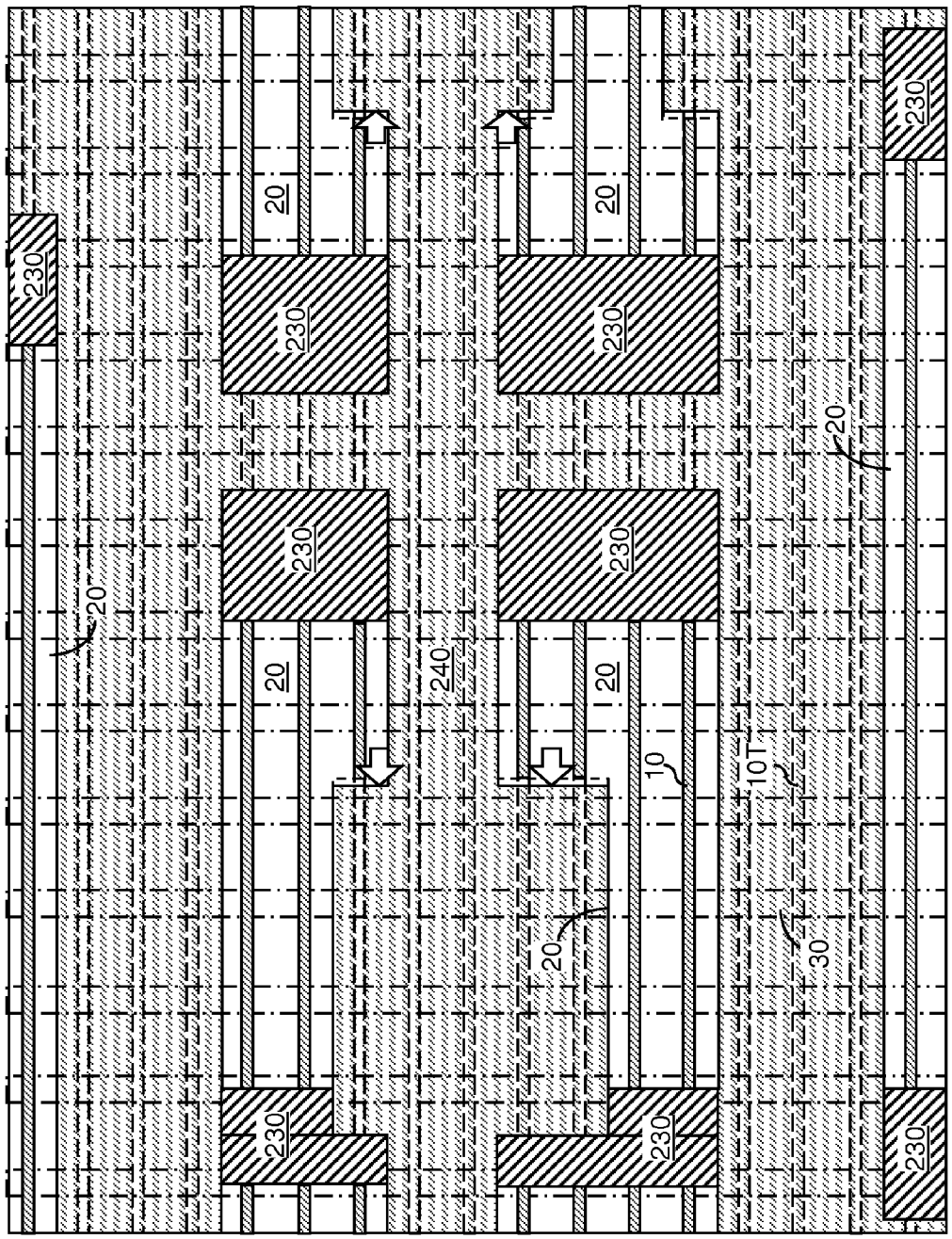
FIG. 6 is a plan view of the first exemplary design layout after biasing taper edges to accommodate process bias during printing according to an embodiment of the present disclosure.

Referring to step FIG. 6 and step 150 of FIG. 1, the taper widthwise edges of the fin region shapes 20 may be optionally biased, i.e., laterally shifted along the lengthwise direction, to minimize the distortion of a horizontal cross-sectional shape of the physical fin structure as manufactured in a fabrication facility relative to the geometry of the corresponding fin shape 10 that the taper widthwise edge touches. The amount of biasing for each taper widthwise edge is dependent on process assumptions and the geometry of the fin region shape and the geometry of the corresponding fin region shape 20. The process assumptions refer to the set of conditions governing the choice of material stacks and processing steps to be employed to manufacture the physical fin structures to implement the design layout. In particular, the relevant material stacks include the type (positive or negative) of photoresist materials to be employed, and the relevant conditions governing the processing steps include the type of reticle, the exposure and focus of the lithographic exposure step, the solvent employed for development, and the etch bias during transfer of a lithographic pattern into an underlying semiconductor material that forms semiconductor fins upon patterning. The distortion of the horizontal cross-sectional shape of a physical fin structure relative to the geometry of the corresponding fin shape 10 due to various factors during manufacture is herein collectively referred to as a "process bias."

In general, the taper edges of the fin region shapes 20 are biased by an offset distance determined by the process assumption. In one embodiment, taper widthwise edges may be biased inward, i.e., into the corresponding fin region shape 20. In another embodiment, taper widthwise edges may be biased outward, i.e., out of the corresponding fin region shape 20. In yet another embodiment, taper widthwise edges may be geometry dependent, and may be inward or outward depending on the geometry.

In one embodiment, the taper edges may be adjusted (biased) based solely on, or primarily on, the process bias of a photoresist material to be subsequently employed. In one embodiment, the taper edges may be biased uniformly (by a same offset distance) to accommodate the process bias. In one embodiment, the value (or values) for the offset distance can be determined by measuring a lateral offset of an end wall of a previously manufactured fin structure relative to a target position for the end wall. The adjustment on the taper edges provide a correction so that a newly manufactured fin structure employing the offset of the taper edges produce a lesser level of distortion of a horizontal cross-sectional shape of the physical fin structure relative to the geometry of the corresponding fin shape 10 that the taper widthwise edge touches prior to the adjustment (biasing).

Figure 7:
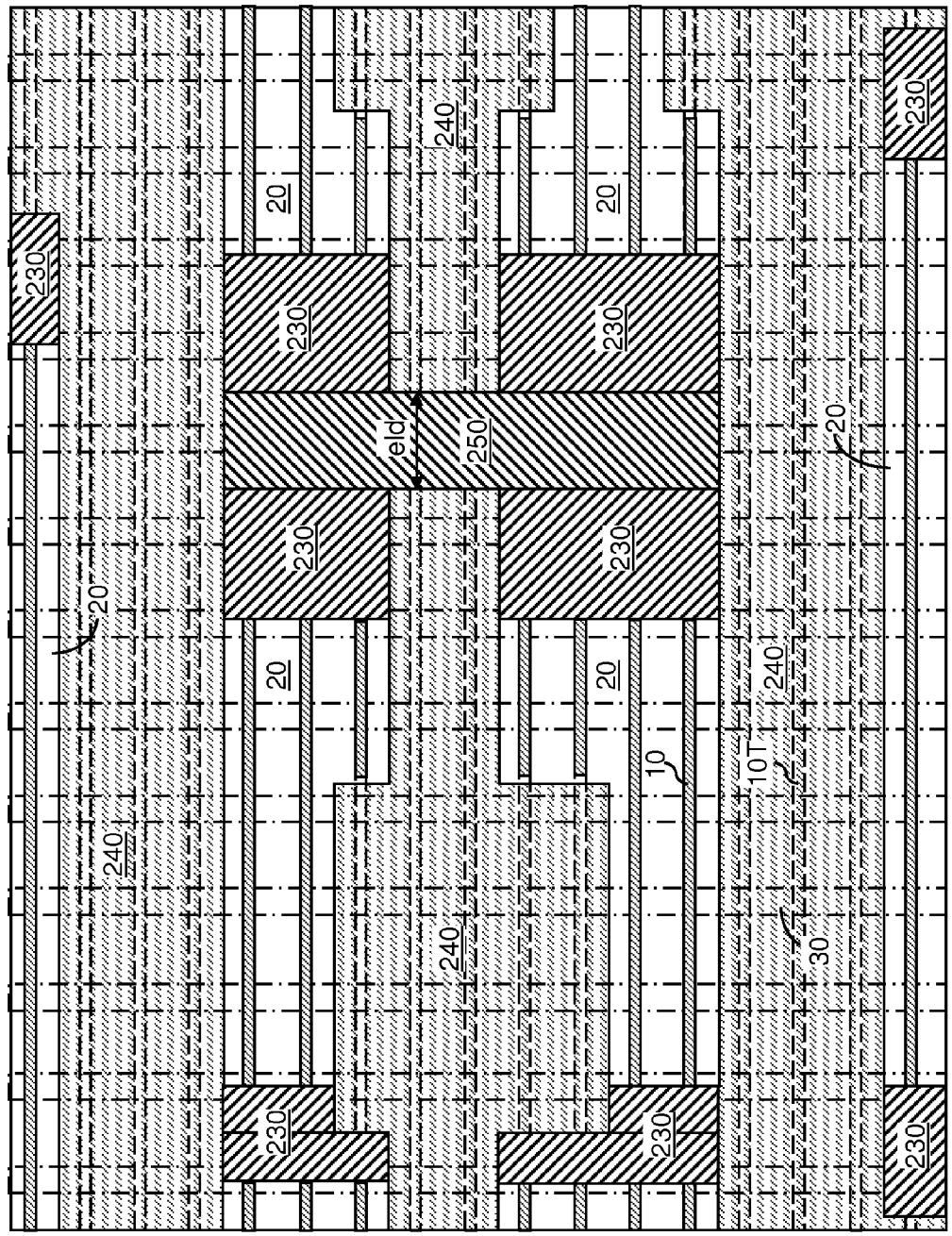
FIG. 7 is a plan view of the first exemplary design layout after formation of an extension shape that connects at least two diffusion shapes along a widthwise direction according to an embodiment of the present disclosure.

Referring to FIG. 7 and step 160 of FIG. 1, at least one extension shape 250 can be optionally formed. Each extension shape 250 connects at least two diffusion shapes along the widthwise direction. Each extension shape 250 is spaced from neighboring non-taper widthwise edges by the diffusion shapes 230 that it touches. Each extension shape 250 can include only a portion of the guiding pattern shapes 240 as generated at step 140, or can include a portion of the guiding pattern shapes 240 as generated at step 140 and at least one portion of one or more diffusion shapes 230. In other words, portions of one or more diffusion shapes 230 may be converted into an extension shape 250.

Each portion of the guiding pattern shapes 240 that is converted into an extension shape 250 is removed from the guiding pattern shape 240. In one embodiment, a portion of each guiding pattern shape 240 may be removed as an extension shape 250 if the portion can connect at least two diffusion shapes 230 along the widthwise direction. In one embodiment, each extension shape 250 can be a rectangular shape. The extension shape 250 has a lengthwise dimension, i.e., a dimension along the lengthwise direction of the fin template shapes 10T, which is herein referred to as an extension lengthwise dimension eld.

The extension lengthwise dimension eld can be selected to facilitate formation of a self-aligned line pattern along the widthwise direction of the fin template shapes 10T. In one embodiment, the extension lengthwise dimension eld can be selected to connect two adjacent extension shapes 230 together so that no guiding pattern shape 240 remains therebetween. In one embodiment, the extension lengthwise dimension can be selected from a set of quantized dimensions. In one embodiment, the set of quantized dimensions can be selected to be substantially the same as a total length of an alternating chain of M domains of a first block polymer unit alternating with (M+1) domains of a second block polymer unit in a directed self-assembly material, in which M is a positive integer.

In one embodiment, the set of quantized dimension can be a set of dimensions given by ka−b, in which a is a sum of a length of a first block polymer unit in a directed self-assembly material and a length of a second block polymer unit in the directed self-assembly material, and b is a length that is less than the sum, and k is a positive integer.

The areas of the diffusion shapes 230 are subtracted from the at least one guiding pattern raw patch shape 220 (at step 140), and if any extension shapes 250 are generated, by subsequently subtracting the areas of the extension shapes 250 at step 160.

Figure 8:
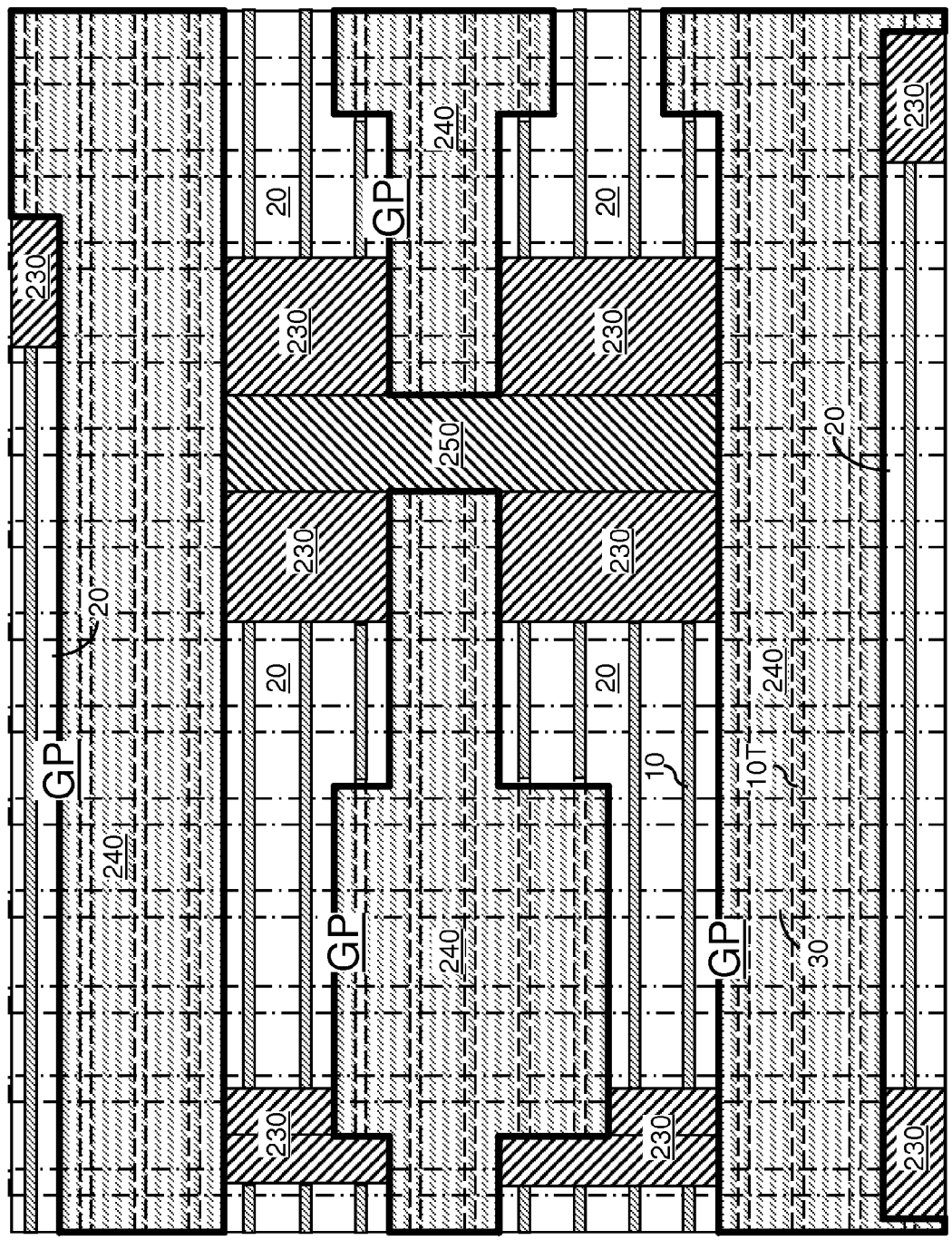
FIG. 8 is a plan view of the first exemplary design layout after generation of a first exemplary set of guiding pattern shapes for a guiding pattern mask according to an embodiment of the present disclosure.

Referring to FIG. 8 and step 170 of FIG. 1, the modified design layout after step 160 can be employed to generate at least one set of guiding pattern shapes 240 for at least one guiding pattern mask. Each of the at least one guiding pattern shape set includes shapes that define a pattern in one of at least one guiding pattern mask. The edges of the guiding pattern shapes 240 are marked with solid lines and marked as "GP."

The guiding pattern shapes 240 can be incorporated into a single guiding pattern mask or a plurality of guiding pattern masks for reproducing the guiding pattern shapes 240 in a guiding pattern design level. The guiding pattern shapes 240 are physically manifested in a photoresist layer. In one embodiment, a single set of guiding pattern shapes 240 may be generated to design a single guiding pattern mask. The guiding pattern level including the guiding pattern shapes 240 is a mask level for which the guiding pattern mask is generated.

The type of the guiding pattern mask and the type of a photoresist material to be employed to print the shapes in the guiding pattern mask can be selected in an arbitrary combination provided that guiding pattern structures that guide the self-assembly of the self-assembly material are formed within the areas marked as "GP." Thus, the guiding pattern mask can be a positive tone mask or a negative tone mask, and the photoresist material can be a positive photoresist material or a negative photoresist material as long as the guiding pattern structures can be formed within the areas marked as "GP." Ordered directed self-assembly of the self-assembly material is performed in areas of a semiconductor substrate that correspond to the complement of the areas marked as "GP" in the design layout.

Figure 9:
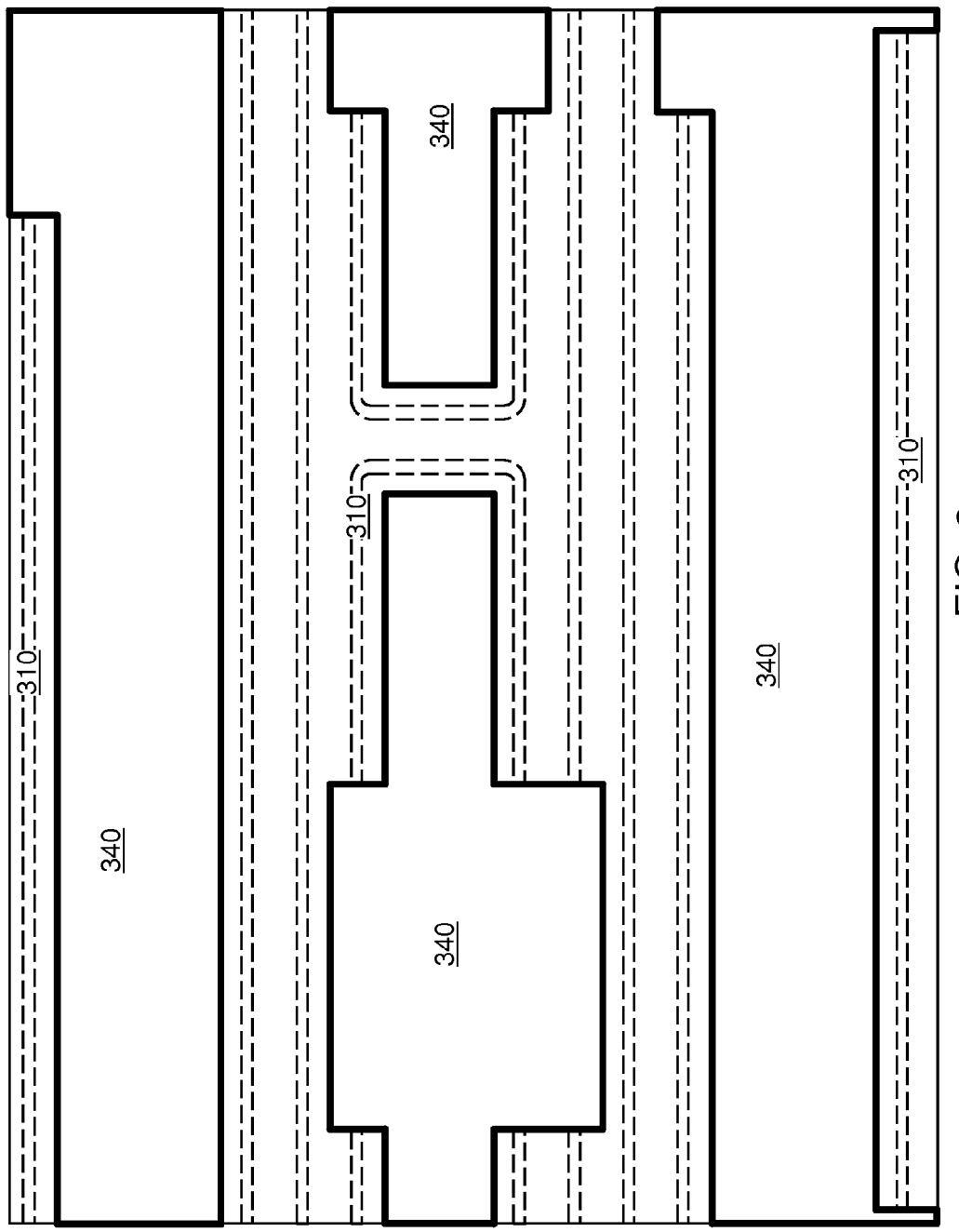
FIG. 9 is a plan view of a directed self-assembly pattern that can be formed employing masks generated from the first exemplary design layout of FIG. 8 according to an embodiment of the present disclosure.

The guiding pattern mask can be employed to lithographically pattern guiding pattern structures during manufacturing of a semiconductor structure implementing the design layout. Referring to FIG. 9, a plan view of a directed self-assembly pattern is shown. The directed self-assembly pattern can be formed employing the guiding pattern mask as illustrated in FIG. 8. Guiding pattern structures 340 can include a developed photoresist material or a patterned dielectric material, which can be formed by transferring the pattern in a developed photoresist layer into an underlying dielectric material layer.

A self-assembled copolymer structure 310 can be formed employing directed self-assembly methods known in the art. The physical area corresponding to the area of the extension shape 250 (See FIG. 7) includes portions of the domains of block polymer units that extend along the widthwise direction unlike other portions of the self-assembled copolymer structure that include domains of block polymer units that extend along the lengthwise direction. The domains that changes directions (i.e., from the lengthwise direction to the widthwise direction and then to the lengthwise direction) enable relief of mechanical stress during the self-assembly of the self-assembly material, thereby reducing the density and probability of defect formation in the lengthwise portions of the domains that are formed within the areas of the fin region shapes 20.

Figure 10:
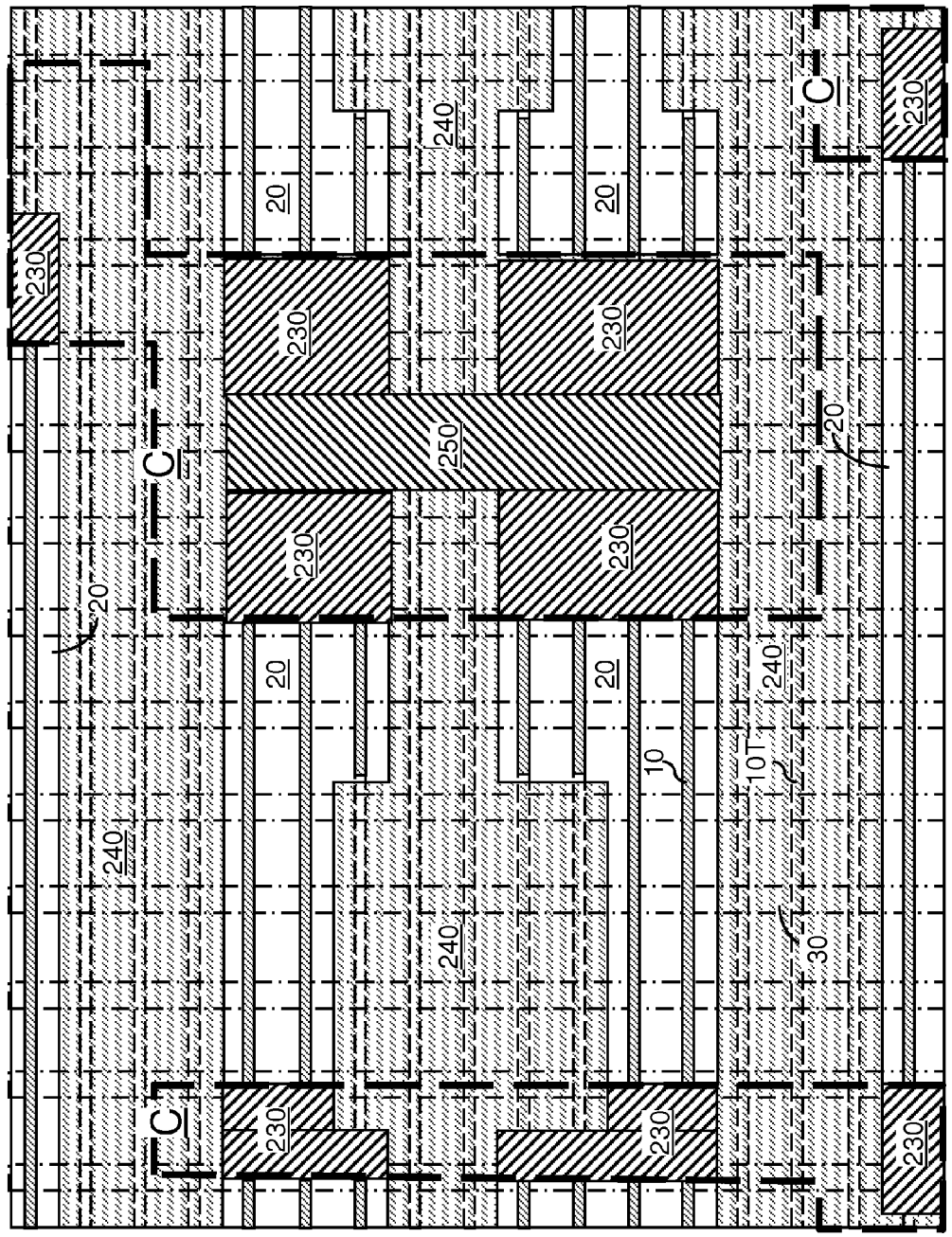
FIG. 10 is a plan view of the first exemplary design layout after generation of a first exemplary set of cut shapes for a cut mask according to an embodiment of the present disclosure.

Referring to FIG. 10, at least one cut shape set is generated from the modified design layout illustrated in FIG. 8. Each of the at least one cut shape set includes shapes that define a pattern in one of at least one cut mask. The cut shapes C can be derived from the diffusion shapes 230, the guiding pattern shapes 240, and any extension shape 250, if present. The cut shapes C can be incorporated into a single cut mask or a plurality of cut masks for reproducing the cut shapes in a cut shape design level. The cut shapes are physically manifested in a photoresist layer.

The cut shapes C can be generated such that the cut shapes C include all areas of the diffusion shapes 230 and all areas of the extension shapes 250. The cut shapes C may include portions of the guiding pattern shapes 240, but do not overlap with the fin regions shapes 20. The cut shapes C define the areas of a physical directed self-assembly pattern from which physical fin structures are to be removed, for example, by etching. The complement of the cut shapes C defines an area in which a photoresist is to protect the physical directed self-assembly pattern. The portions of the guiding pattern shapes 240 to be included within the fin shapes C can be determined to maximize overlay tolerance, i.e., to increase the robustness of the fidelity of the shapes of physical fin structures after etching with respect to the shapes of the fin shapes 10 as provided in the initial design layout.

In general, the combination of the guiding pattern shapes 240 and the cut shapes C can be employed to generate a set of at least one guiding pattern mask and at least one cut mask. The guiding pattern shapes can define at least one guiding pattern mask for patterning guiding pattern structures 340 (See FIG. 9) on a semiconductor substrate, and the cut shapes can define at least one cut mask for patterning cut region for etching, from which portions of any remaining self-assembled copolymer structure 310 or physical structures replicating a self-assembly pattern of a self-assembled copolymer structure 310 (which is removed prior to the etching).

Figure 11:
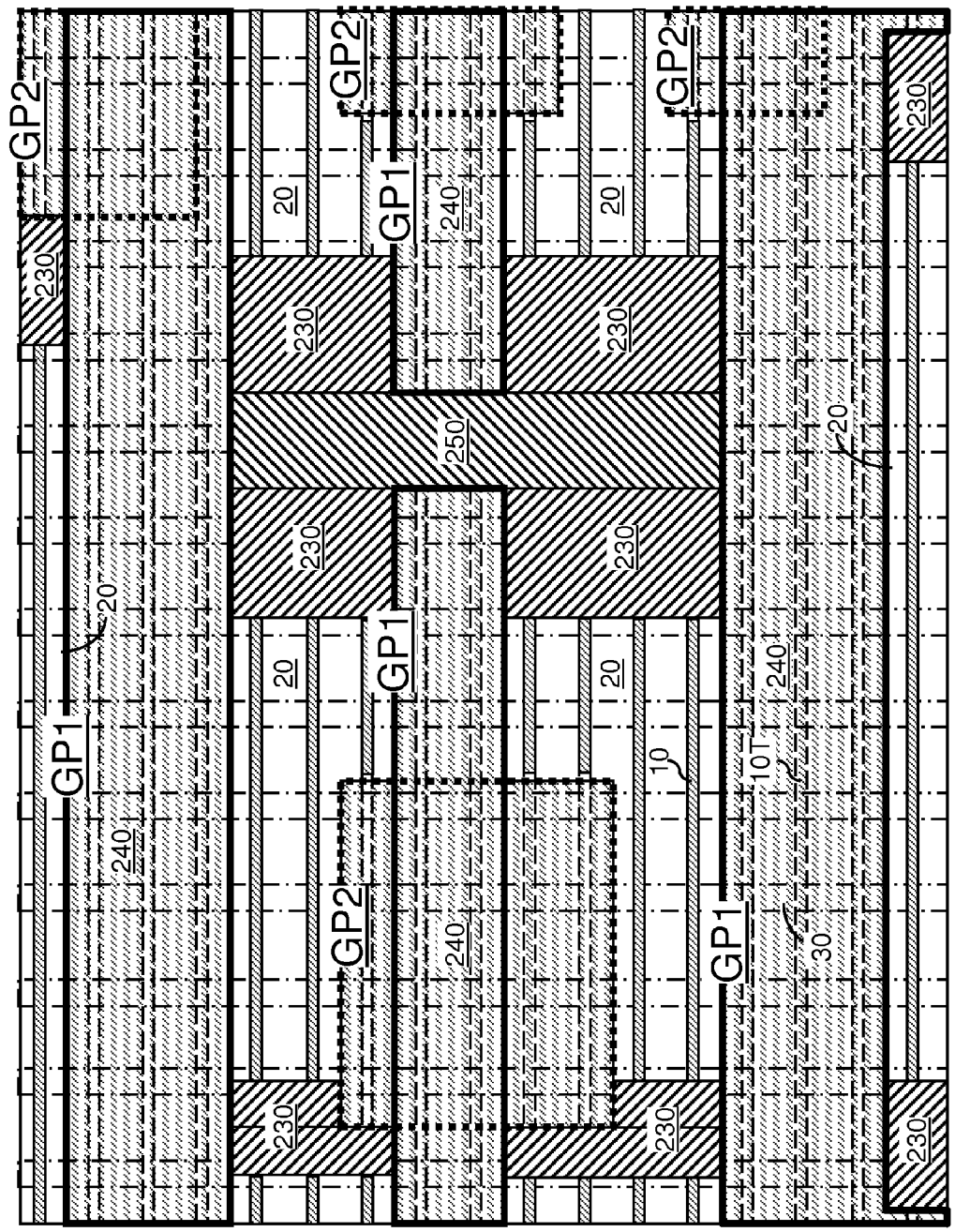
FIG. 11 is a plan view of the first exemplary design layout after generation of a second exemplary set of guiding pattern shapes for a plurality of guiding pattern masks according to an embodiment of the present disclosure.

Referring to FIG. 11, a second exemplary set of guiding pattern shapes 240 for a plurality of guiding pattern masks is illustrated. The plurality of guiding pattern masks can be formed by a mask decomposition method. As used herein, "mask decomposition" refers to a method of generating a set of mask level design layouts for a plurality of lithographic masks for the purpose of implementing design shapes in a single design level.

In one embodiment, the at least one guiding pattern shape set can be P guiding pattern shape sets, and the at least one guiding pattern mask can be P guiding pattern masks, in which P is an integer greater than 1. For example, the plurality of guiding pattern masks can include a first guiding pattern mask including first guiding pattern shapes GP1 and a second guiding pattern mask including second guiding pattern shapes GP2.

Figure 12:
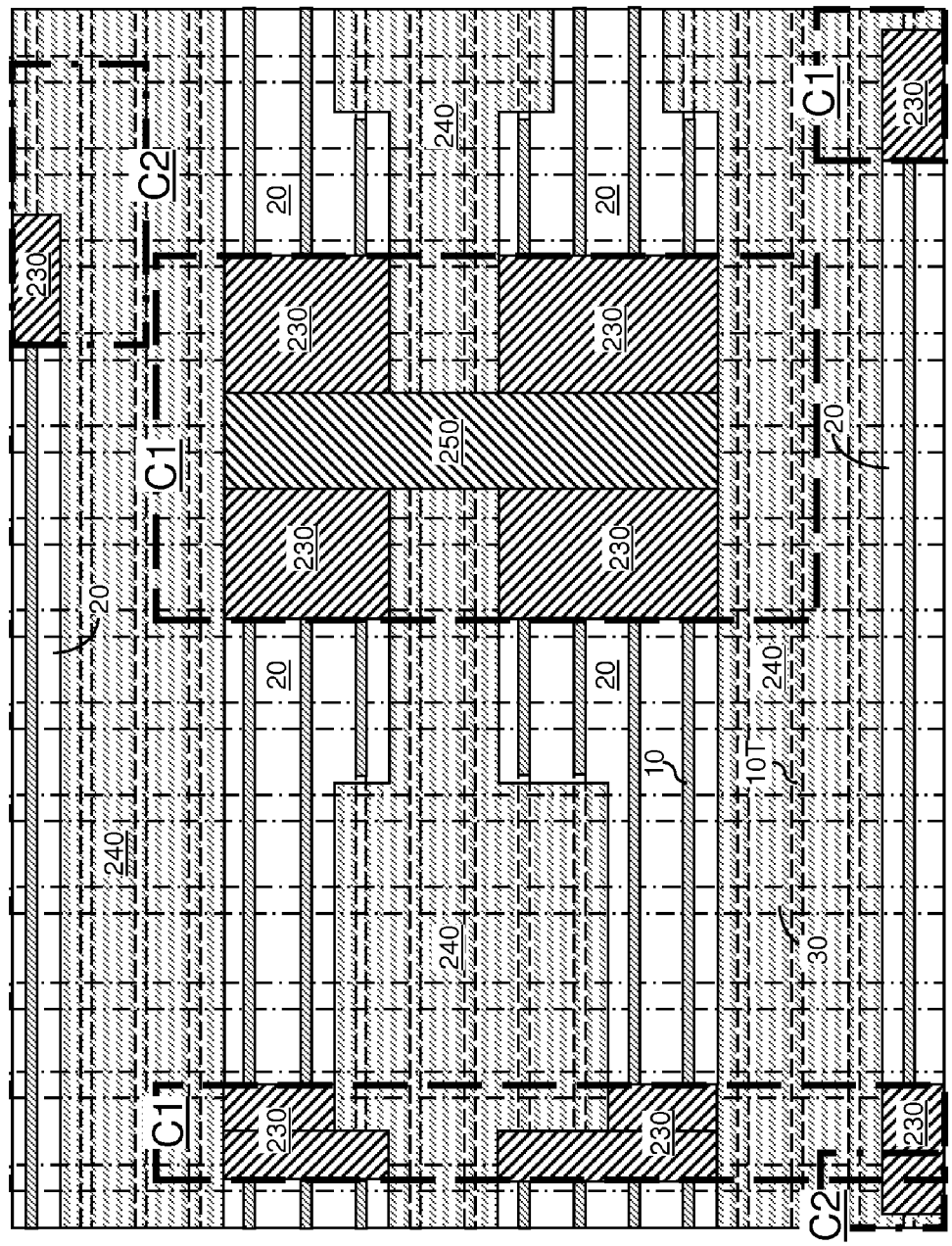
FIG. 12 is a plan view of the first exemplary design layout after generation of a second exemplary set of cut shapes for a plurality of cut masks according to an embodiment of the present disclosure.

Referring to FIG. 12, a second exemplary set of cut shapes (C1, C2) for a plurality of cut masks is illustrated. The plurality of cut masks can be formed by a mask decomposition method.

In one embodiment, the at least one cut shape set can be Q guiding pattern shape sets, and the at least one cut mask can be Q cut masks, in which Q is an integer greater than 1. For example, the plurality of cut masks can include a first cut mask including first cut shapes C1 and a second cut mask including second cut masks C2.

Figure 13:
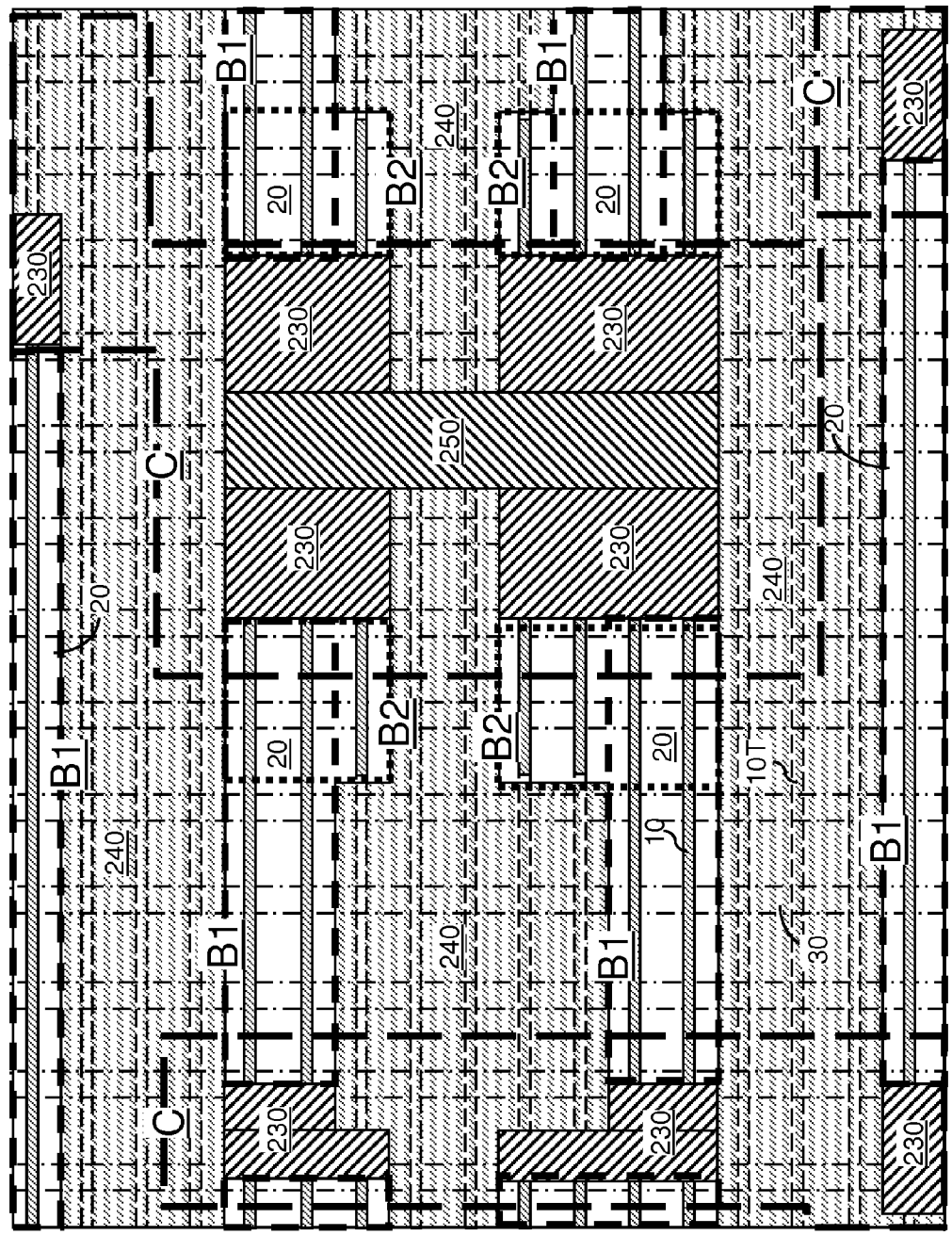
FIG. 13 is a plan view of the first exemplary design layout after generation of exemplary sets of blocking shapes for at least one blocking shape mask and a set of cut shapes for at least one cut mask according to an embodiment of the present disclosure.

Alternate mask decomposition schemes can also be employed to generate at least one guiding pattern mask and at least one cut mask. For example, at least one blocking shape mask that defines regions to be protected from an etch can be employed in conjunction with at least one cut mask. Referring to FIG. 13, is a plan view of the first exemplary design layout is shown after generation of exemplary sets of blocking shapes (B1, B2) for at least one blocking shape mask and a set of cut shapes C for at least one cut mask.

The at least one set of blocking shapes (B1, B2) can be generated from the combination of the guiding pattern shapes 240, the diffusion shapes 230, and the optional extension shapes 250 such that the areas of the at least one set of blocking shapes (B1, B2) include all regions in which fin structures are to be formed. Each of the at least one blocking shape set (B1 or B2) includes shapes that define a pattern in a blocking shape mask, and the collection of the at least one blocking shape set (B1 and B2) coincide with the fin region shapes 20 as provided at a step of the generating the at least one guiding pattern shape set such as the step of FIG. 8.

Use of the at least one blocking mask can provide a greater overlay tolerance to the cut shapes C in a cut mask. Thus, the at least one cut shape set C can encompass at least a portion of the fin region shapes 20.

During a lithographic process that defines opening from which to remove physically exposed portions of physical fin structures, a negative photoresist material can be applied over a substrate including physical fin structures in areas corresponding to the complement of the guiding pattern structures 340 (See FIG. 9). A "negative photoresist material" refers to a photoresist material that becomes insoluble to a developer solution upon exposure to radiation. Thus, the areas corresponding to a first set of blocking shapes B1 and the areas corresponding to a second set of blocking shapes B2 can be sequentially lithographically exposed to form cross-linked insoluble photoresist material portions. In addition, areas corresponding to the complement of the cut shapes C are lithographically exposed to render the lithographically exposed portions of the negative photoresist material insoluble in the developer solution. Upon development, the area from which the photoresist material is removed is given by subtracting the areas corresponding to the first and second sets of blocking shapes (B1, B2) from the areas corresponding to the cut shapes C. As used herein, a subtraction of a second set from a first set refers to a set operation in which elements common to both sets are removed from the first set. The use of blocking shape sets allows greater overlay tolerance for the lithographic step for printing the images of at least one cut mask.

Figure 14:
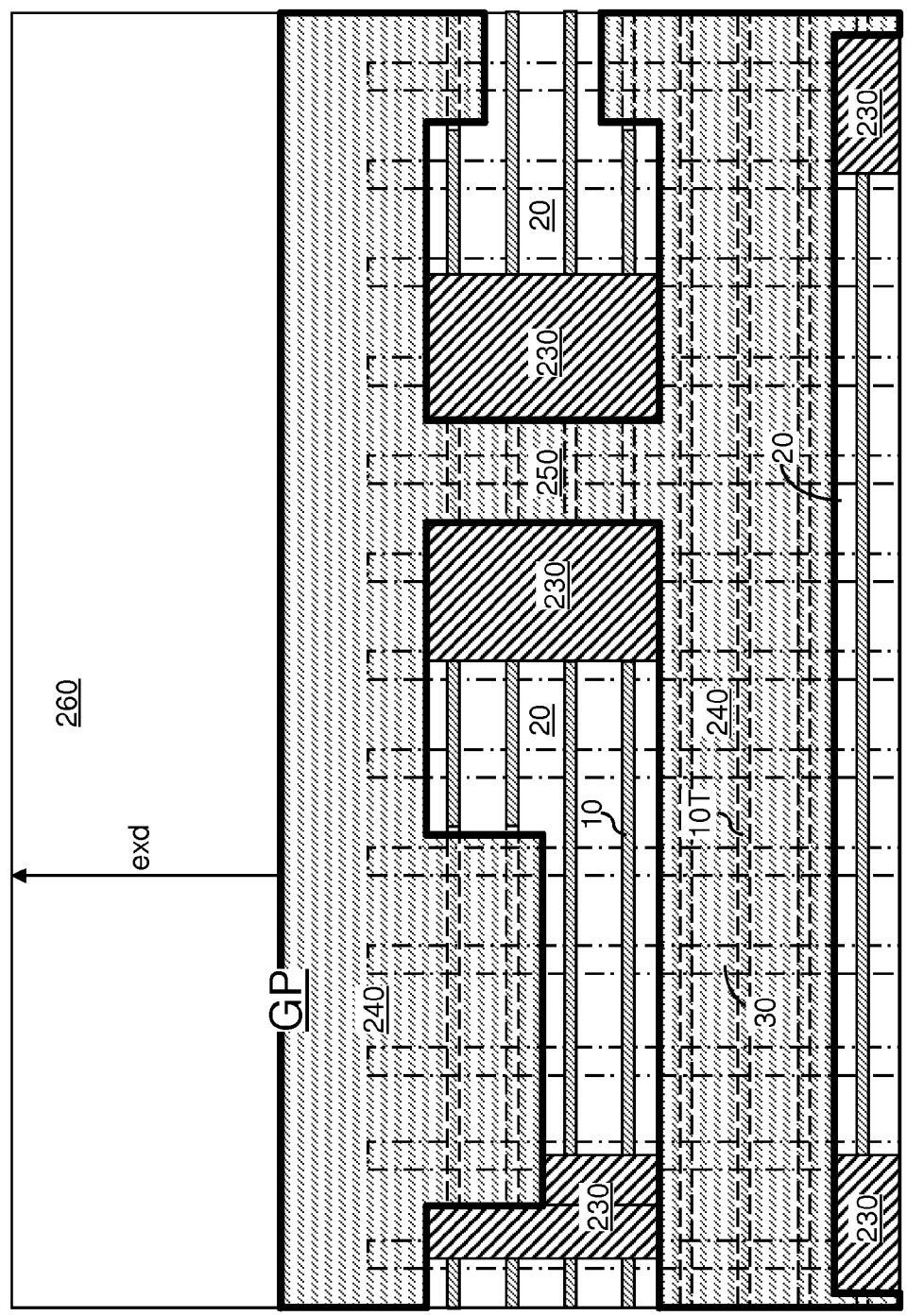
FIG. 14 is a plan view of a second exemplary design layout after generation of at least one cell/macro edge extension shapes according to an embodiment of the present disclosure.

Optionally, the guiding pattern shapes 250 and the cut shapes {C or (C1, C2)} may be adjusted to accommodate effects at device cell edges and at device macro edges. Referring to FIG. 14 and step 180 of FIG. 1, a second exemplary design layout is shown after generation of at least one guiding pattern shapes 240 for a guiding pattern mask. The second exemplary design layout can be a subset of a larger design layout. The second exemplary design layout can be another portion of a larger design layout that includes the first exemplary design layout. The second exemplary design layout includes a plurality of design levels that include the same design levels as the first exemplary design layout, and can optionally include cell/macro edge extension shapes 260 that is added to the edges of each device cell and to edges of each device macro. The distance by which the cell/macro edge extension shapes 260 extend beyond the peripheries of each device cell and device macro is herein referred to as an edge extension distance exd.

Figure 15:
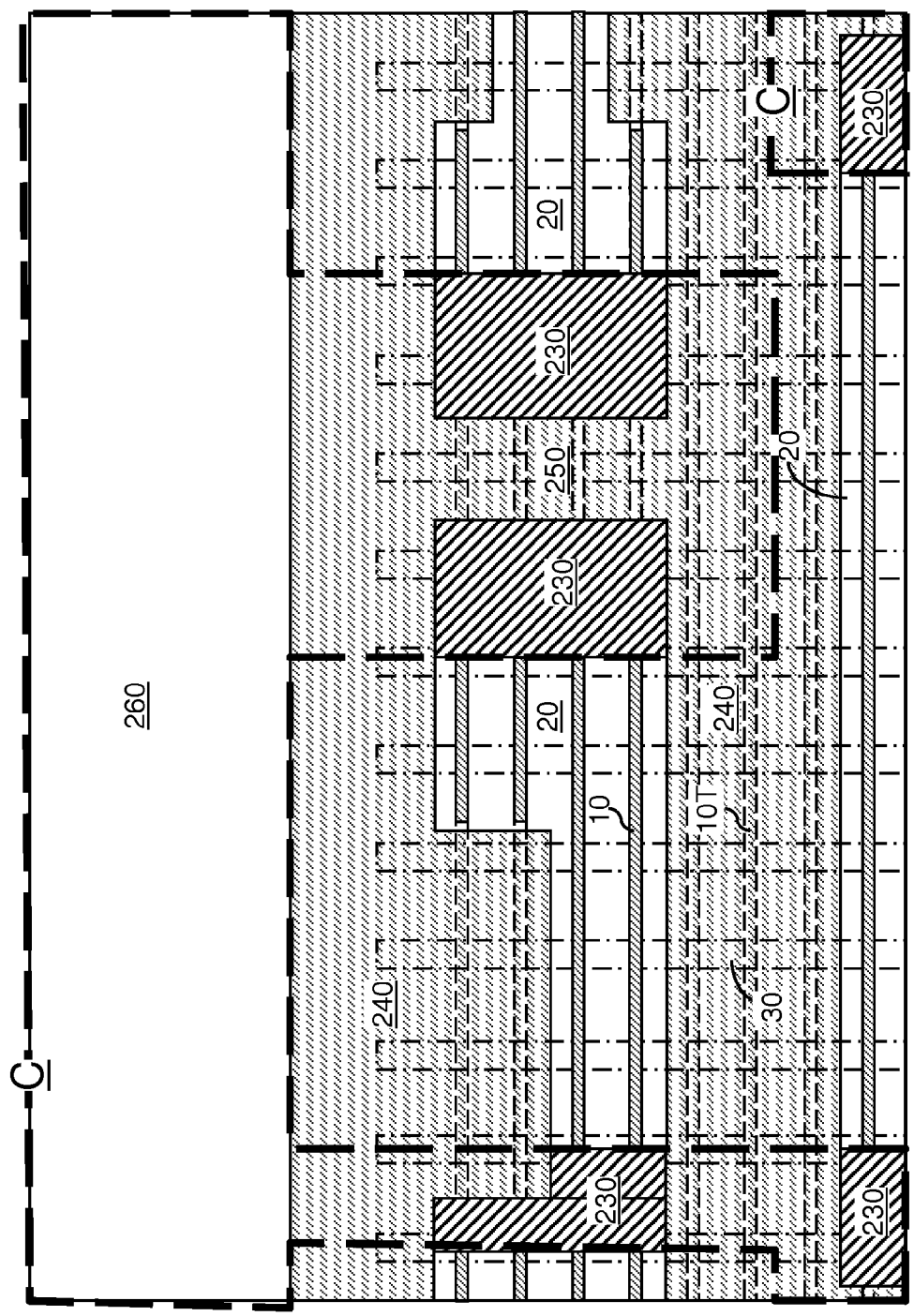
FIG. 15 is a plan view of the second exemplary design layout after modification of cut shapes for a cut mask according to an embodiment of the present disclosure.

Referring to FIG. 15, cut shapes C for a cut mask can be modified to include the areas of the cell/macro edge extension shapes 260. Inclusion of the areas of the cell/macro edge extension shapes 260 ensures that self-assembly patterns are removed from the periphery of each device cell and each device macro.

Figure 16:
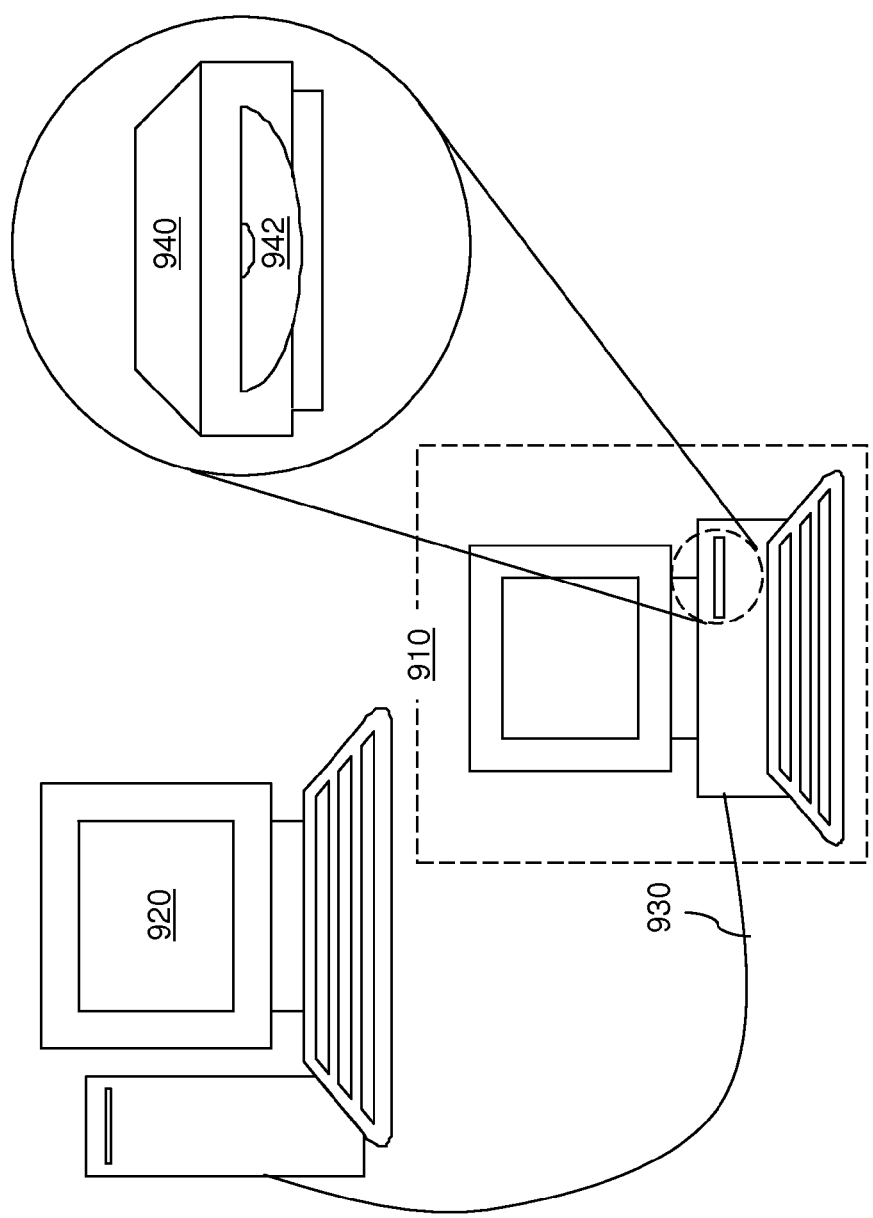
FIG. 16 illustrates an exemplary apparatus that can be employed to implement the methods of various embodiments of the present disclosure.

Referring to FIG. 16, an exemplary apparatus is illustrated, which can be employed to implement the methods of various embodiments of the present disclosure. The apparatus can be configured to perform at least one and/or any of the steps in the flow chart in FIG. 1 in an automated step by running an automated program on any computing means known in the art. The apparatus can be employed to decompose design shapes in a design level into a plurality of target design levels. The apparatus includes one or more processors in communication with a memory and is configured to run an automated program.

The automated program can include any or all of the steps of the flow chart of FIG. 1. In one embodiment, the apparatus can include at least one computing means 910 including one or more processor units that are in communication with a memory. The at least one computing means 910 can include a computer as known in the art. The at least one computing means 910 can be in communication with a database 920, which can be a standalone computing means or can be incorporated into the at least one computing means 910. The database can store all or a subset of the design shapes for the design levels provided at step 100 of FIG. 1 or generated at later processing steps. If the database 920 is a standalone computing means, a data cable 930 or wireless communication can be employed to transfer data between the database 920 and the at least one computing means 910. The database can store information on process assumptions, and any or all of predefined parameters to be employed while the automated program runs.

The at least one computing means 910 can be employed to perform at least one or all of the steps described above with, or without, human intervention depending on the program that runs thereupon. The input data and the output data (e.g., the design for a pupil filter according to various embodiments of the present disclosure) can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The design data can include the various design shapes for the design level as originally provided, and for each and/or all of the various mask level design layouts of the present disclosure. The design data for the mask level design layouts of the present disclosure can be transferred to a manufacturing facility that can manufacture a set of lithographic masks corresponding to the design shapes for the mask level design layouts. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

A machine-readable medium embodying the design data for the mask level design layouts of the present disclosure can have the functionality of generating a representation, in a format perceptible by humans or recognizable by an automated machine (such as an optical character reader or a program configured to recognize graphics data), of a semiconductor structure, a semiconductor device, a semiconductor circuit, or any other physical implementation of the devices and structures of the present disclosure. The design data for the mask level design layouts of the present disclosure, as embodied in the machine-readable medium, can be organized such that the inherent physical or logical relationship among data elements can be represented in a temporary or permanent display device such as a computer monitor or at least one printed sheet of paper. Further, the design data for the mask level design layouts of the present disclosure can be designed to support specific data manipulation functions, including, but not limited to, editing, adding, subtracting, or otherwise modifying or modulating the various data elements within the design data for the mask level design layouts. In addition, the design data for the mask level design layouts of the present disclosure can be configured to cause the representation in the format perceptible by humans or recognizable by an automated machine to include various display elements (e.g., line, curves, symbols, areas, volumes, etc.) that correspond to each of the various data elements within the design data for the mask level design layouts. The design data for the mask level design layouts of the present disclosure can be a functional descriptive material as recorded on the machine-readable medium, and as such, can become structurally and functionally interrelated to the machine-readable medium so as to change the format and organization of the various memory elements within the machine-readable medium and confer a functionality of generating at least one visual representation when read by a display program, which can be a visual display program or a printing program, and can reside in a computing device, or can be encoded within the same machine-readable medium, or can be encoded within a different machine-readable medium that can be read by the same computing device that reads the machine-readable medium encoding the design data for the mask level design layouts of the present disclosure.

In one embodiment, a machine-readable medium embodying the design data for the mask level design layouts of the present disclosure can additionally encode a computer program that enables the generation of a representation, in a format perceptible by humans or recognizable by an automated machine. In one embodiment, the computer program that enables the generation of a representation, in a format perceptible by humans or recognizable by an automated machine can reside in a computing device or in another machine-readable medium that can be read by a computing device configured to read the machine-readable medium embodying the design data for the mask level design layouts of the present disclosure.

Upon running of the computer program on the design data for the mask level design layouts of the present disclosure, a representation of the design data for the t mask level design layouts can be generated in a format perceptible by humans or recognizable by an automated machine, which can be employed to design, manufacture, and/or to test any of a semiconductor structure, a semiconductor device, a semiconductor circuit, or any other physical implementation of the devices, structures and/or circuits of the present disclosure as embodied in the design data for the mask level design layouts. Alternately or additionally, a representation of the design data for the mask level design layouts as generated in a format perceptible by humans or recognizable by an automated machine can be employed to design, manufacture, and/or to test any design for a semiconductor structure, a semiconductor device, a semiconductor circuit, or any other physical implementation of the devices and structures of the present disclosure as embodied in the design data for the mask level design layouts.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method for generating shapes for mask design levels for patterning fin structures, said method comprising:
   a first step of providing an initial design layout including fin template shapes and fin region shapes, wherein intersections of said fin template shapes and said fin region shapes correspond to target areas for fin structures;
   a second step of quantizing widths of, and centering, channel regions between lengthwise edges neighboring pairs of said fin region shapes by moving said lengthwise edges along a widthwise direction, wherein said quantized widths are based on a characteristic dimension of a self-assembly material;
   a third step of generating at least one guiding pattern raw patch shape as at least one shape that correspond to complementary areas of said fin region shapes;
   a fourth step of generating diffusion shapes by extending lengthwise edges of said fin region shapes along a lengthwise direction;
   a fifth step of generating at least one guiding pattern shape by subtracting areas of said diffusion shapes from said at least one guiding pattern raw patch shape;
   a sixth step of generating at least one guiding pattern shape set, wherein each of said at least one guiding pattern shape set includes shapes that define a pattern in one of at least one guiding pattern mask; and
   a seventh step of generating at least one cut shape set, wherein each of said at least one cut shape set includes shapes that define a pattern in one of at least one cut mask, wherein at least one step among said second, third, fourth, fifth, sixth, and seventh steps is performed employing an apparatus comprising one or more processors in communication with a memory and configured to perform said at least one step.

2. The method of claim 1, further comprising biasing taper edges of said fin region shapes by an offset distance determined by a process assumption.

3. The method of claim 2, further comprising determining a value for said offset distance by measuring a lateral offset of an end wall of a manufactured fin structure relative to a target position for said end wall.

4. The method of claim 1, further comprising generating at least one extension shape that connects at least two of said diffusion shapes along said widthwise direction.

5. The method of claim 4, wherein a lengthwise dimension of each of said at least one extension shape is selected from a set of quantized dimensions.

6. The method of claim 5, wherein said set of quantized dimensions are selected to be substantially the same as a total length of an alternating series of M domains of a first polymer unit alternating with (M+1) domains of a second polymer unit in a directed self-assembly material, wherein M is a positive integer.

7. The method of claim 5, wherein said set of quantized dimension is a set of dimensions given by ka−b, wherein a is a sum of a length of a first polymer domain in a directed self-assembly material and a length of a second polymer domain in said directed self-assembly material, and b is a fixed length that is less than said sum, and k is a positive integer.

8. The method of claim 1, wherein said quantizing of said channel regions is performed such that each channel regions has a width selected from a set of quantized dimensions.

9. The method of claim 8, wherein said set of quantized dimensions are selected such that a width of each neighboring fin region shape is substantially the same as a total length of an alternating series of N domains of a first polymer unit alternating with (N+1) domains of a second polymer unit in a directed self-assembly material, wherein N is a positive integer.

10. The method of claim 8, wherein said set of quantized dimension is a set of dimensions given by ja−b, wherein a is a sum of a length of a first polymer domain in a directed self-assembly material and a length of a second polymer domain in said directed self-assembly material, and b is a fixed length that is less than said sum, and j is a positive integer.

11. The method of claim 1, wherein said at least one guiding pattern shape set is P guiding pattern shape sets and said at least one guiding pattern mask is P guiding pattern masks, wherein P is an integer greater than 1.

12. The method of claim 1, wherein said at least one cut shape set is Q cut pattern shape sets and said at least one cut mask is Q cut masks, wherein Q is an integer greater than 1.

13. The method of claim 1, further comprising generating at least one blocking shape set, wherein each of said at least one blocking shape set includes shapes that define a pattern in one of at least one blocking shape mask, and a collection of said at least one blocking shape set coincide with said fin region shapes at a step of said generating of said at least one guiding pattern shape set.

14. The method of claim 13, wherein said at least one cut shape set encompasses at least a portion of said fin region shapes.

15. An apparatus for generating shapes for mask design levels for patterning fin structures, said apparatus comprising one or more processors in communication with a memory and configured to run an automated program, said automated program including:

a first step of receiving an initial design layout including fin template shapes and fin region shapes, wherein intersections of said fin template shapes and said fin region shapes correspond to target areas for fin structures;

a second step of quantizing widths of, and centering, channel regions between lengthwise edges neighboring pairs of said fin region shapes by moving said lengthwise edges along a widthwise direction, wherein said quantized widths are based on a characteristic dimension of a self-assembly material;

a third step of generating at least one guiding pattern raw patch shape as at least one shape that correspond to complementary areas of said fin region shapes;

a fourth step of generating diffusion shapes by extending lengthwise edges of said fin region shapes along a lengthwise direction;

a fifth step of generating at least one guiding pattern shape by subtracting areas of said diffusion shapes from said at least one guiding pattern raw patch shape;

a sixth step of generating at least one guiding pattern shape set, wherein each of said at least one guiding pattern shape set includes shapes that define a pattern in one of at least one guiding pattern mask; and a seventh step of generating at least one cut shape set, wherein each of said at least one cut shape set includes shapes that define a pattern in one of at least one cut mask.

16. The apparatus of claim 15, wherein said automated program further comprises biasing taper edges of said fin region shapes by an offset distance determined by a process assumption.

17. The apparatus of claim 15, wherein said automated program further comprises generating at least one extension shape that connects at least two of said diffusion shapes along said widthwise direction.

18. The apparatus of claim 17, wherein a lengthwise dimension of each of said at least one extension shape is selected from a set of quantized dimensions.

19. The apparatus of claim 15, wherein said quantizing of said channel regions is performed such that each channel regions has a width selected from a set of quantized dimensions.

20. The apparatus of claim 19, wherein said set of quantized dimensions are selected such that a width of each neighboring fin region shape is substantially the same as a total length of an alternating series of N domains of a first polymer unit alternating with (N+1) domains of a second polymer unit in a directed self-assembly material, wherein N is a positive integer.

* * * * *